US008172596B2

(12) United States Patent
Siebens

(10) Patent No.: US 8,172,596 B2
(45) Date of Patent: May 8, 2012

(54) ELECTRICAL CONNECTOR WITH SACRIFICIAL APPENDAGE

(75) Inventor: Larry N. Siebens, Asbury, NJ (US)

(73) Assignee: Thomas & Betts International, Inc., Wilmington, DE (US)

( * ) Notice: Subject to any disclaimer, the term of this patent is extended or adjusted under 35 U.S.C. 154(b) by 0 days.

(21) Appl. No.: 13/038,955

(22) Filed: Mar. 2, 2011

(65) Prior Publication Data

US 2011/0217876 A1 Sep. 8, 2011

Related U.S. Application Data

(60) Provisional application No. 61/309,919, filed on Mar. 3, 2010.

(51) Int. Cl.
*H01R 13/62* (2006.01)
(52) U.S. Cl. .............................................. 439/301
(58) Field of Classification Search .......... 439/301–304, 439/88–89; 29/402.04
See application file for complete search history.

(56) References Cited

U.S. PATENT DOCUMENTS

| | | | |
|---|---|---|---|
| 1,902,617 A | 3/1933 | Burr | |
| 2,937,359 A | 5/1960 | Cronin et al. | |
| 3,343,153 A | 9/1967 | Waehner | |
| 3,390,331 A | 6/1968 | Brown et al. | |
| 3,980,374 A | 9/1976 | Fallot | |
| 4,721,355 A * | 1/1988 | Gould | 385/76 |
| 4,760,327 A | 7/1988 | Walsh et al. | |
| 4,794,331 A | 12/1988 | Schweitzer, Jr. | |
| 4,904,932 A | 2/1990 | Schweitzer, Jr. | |
| 4,915,641 A * | 4/1990 | Miskin et al. | 439/247 |
| 4,946,393 A | 8/1990 | Borgstrom et al. | |
| 5,367,251 A | 11/1994 | McTigue | |
| 6,210,206 B1 | 4/2001 | Durham | |
| 6,332,785 B1 | 12/2001 | Muench, Jr. et al. | |
| 6,843,685 B1 | 1/2005 | Borgstrom et al. | |
| 7,150,098 B2 | 12/2006 | Borgstrom et al. | |
| 7,154,281 B2 | 12/2006 | Piesinger | |
| 7,288,718 B2 | 10/2007 | Stepniak et al. | |
| 7,898,356 B2 * | 3/2011 | Sherrer et al. | 333/34 |
| 8,052,350 B2 * | 11/2011 | Roodenburg et al. | 405/166 |
| 2005/0061121 A1* | 3/2005 | Lauderbaugh | 83/13 |
| 2005/0272294 A1* | 12/2005 | Ostendorp | 439/301 |
| 2006/0246761 A1* | 11/2006 | Ostendorp | 439/301 |
| 2009/0029582 A1* | 1/2009 | Nguyen et al. | 439/301 |
| 2009/0181567 A1* | 7/2009 | Stockton et al. | 439/271 |

* cited by examiner

*Primary Examiner* — Chandrika Prasad
(74) *Attorney, Agent, or Firm* — Snyder, Clark, Lesch & Chung, LLP

(57) ABSTRACT

An electrical connector assembly may include a yoke that includes an outer housing and a central conductor provided within the outer housing. The central conductor may include at least three outwardly extending portions. A first outwardly extending portion and a second outwardly extending portion maybe operatively coupled to first and second power cables, respectively. A third outwardly extending portion may include a sacrificial appendage configured to be cut through to confirm that the electrical connector is de-energized.

21 Claims, 8 Drawing Sheets

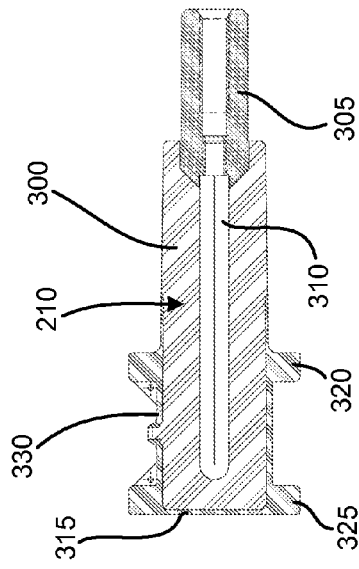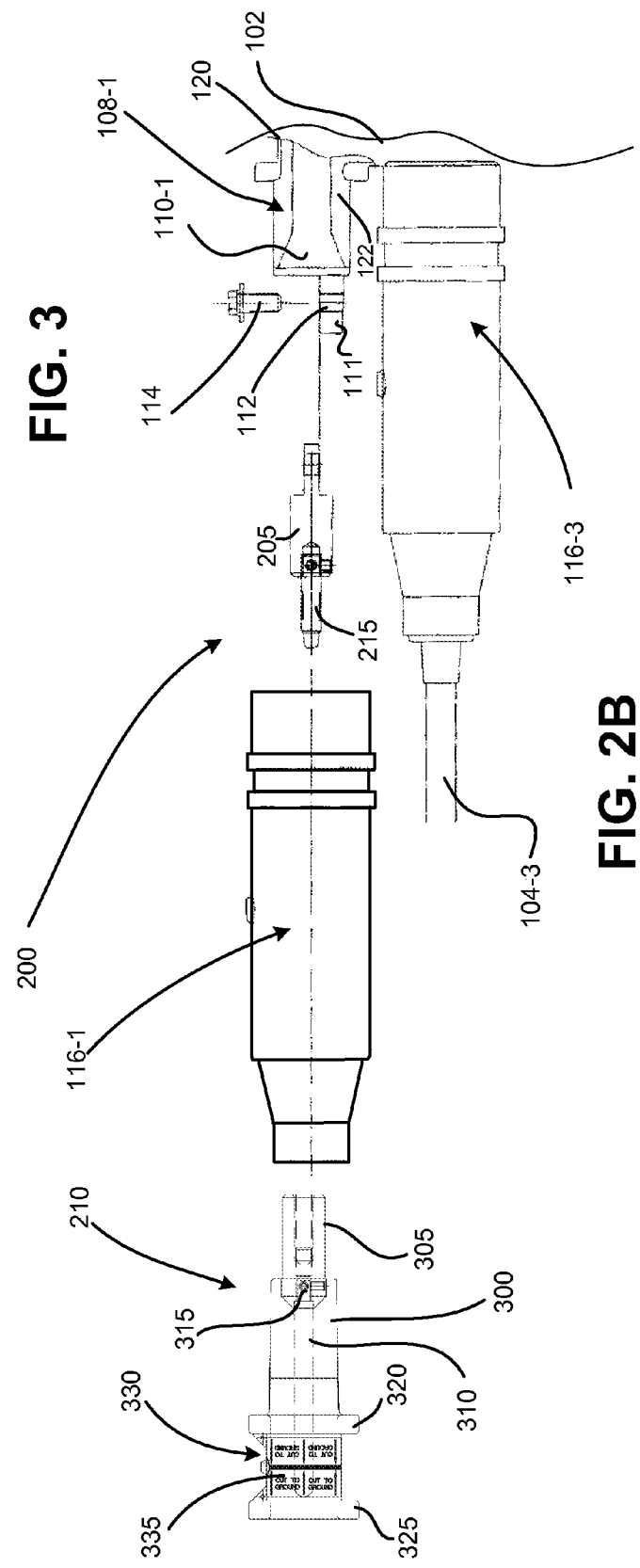

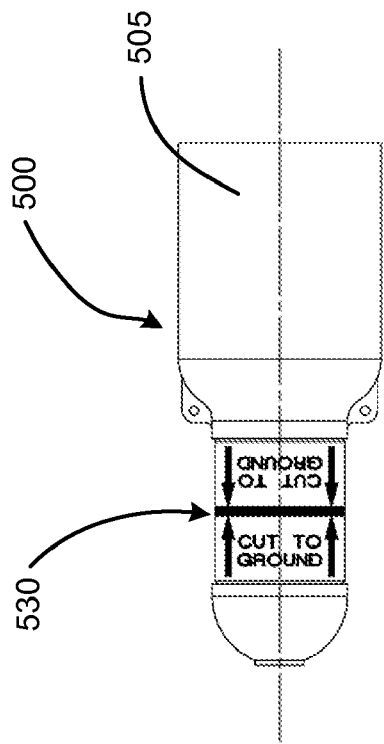
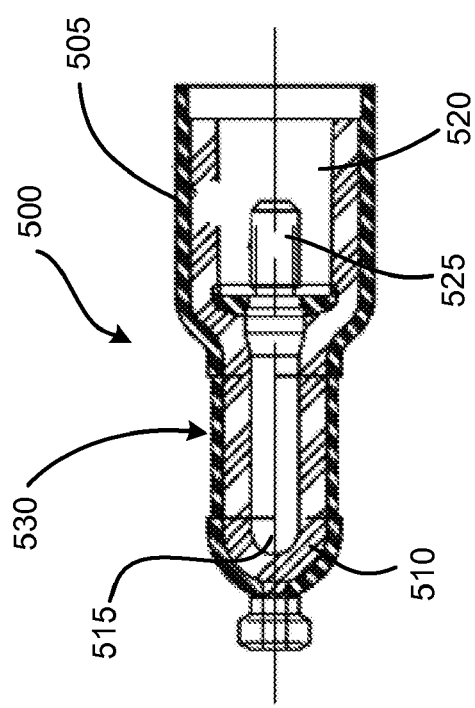
FIG. 5B
FIG. 5A

ELECTRICAL CONNECTOR WITH SACRIFICIAL APPENDAGE

CROSS-REFERENCE TO RELATED APPLICATION

This application claims priority under 35. U.S.C. §119, based on U.S. Provisional Patent Application No. 61/309,919 filed Mar. 3, 2010, the disclosure of which is hereby incorporated by reference herein.

BACKGROUND OF THE INVENTION

The present invention relates to electrical cable connectors, such as splicing connectors for joining two or more electrical cables, loadbreak connectors, and deadbreak connectors. More particularly, aspects described herein relate to an electrical cable connector that includes a feature for enabling personnel to ensure that the connector is de-energized.

High and medium voltage electrical connectors and components typically operate in the 15 to 35 kilovolt (kV) range. Because such voltages are potentially very dangerous, it is typically necessary for personnel to confirm that the power is disconnected before commencing work or repair. Known methods of visual or physical de-energizing confirmation include "spiking the cable," in which a grounded spike is driven thru the cable and into the conductor or a grounded hydraulic cable cutter is used to physically cut the cable in half.

Unfortunately, after a cable is "spiked," the utility is required to replace the cable or increase its length by adding a splice and additional cable in order to reconnect to the system. This is costly and time consuming.

BRIEF DESCRIPTION OF THE DRAWINGS

FIG. 2B illustrates the power cable splicing connector of FIG. 2A in an exploded (e.g., unassembled) view;

FIG. 3 is a cross-sectional view of the sacrificial adapter of FIGS. 2A and 2B;

FIG. 5A is a cross-sectional view of an alternative sacrificial appendage for use with the splicing connector of FIGS. 4A and 4B; and FIG. 5B is side view of the alternative sacrificial appendage of FIG. 5A.

DETAILED DESCRIPTION OF THE PREFERRED EMBODIMENTS

The following detailed description refers to the accompanying drawings. The same reference numbers in different drawings may identify the same or similar elements.

Figure 1A:
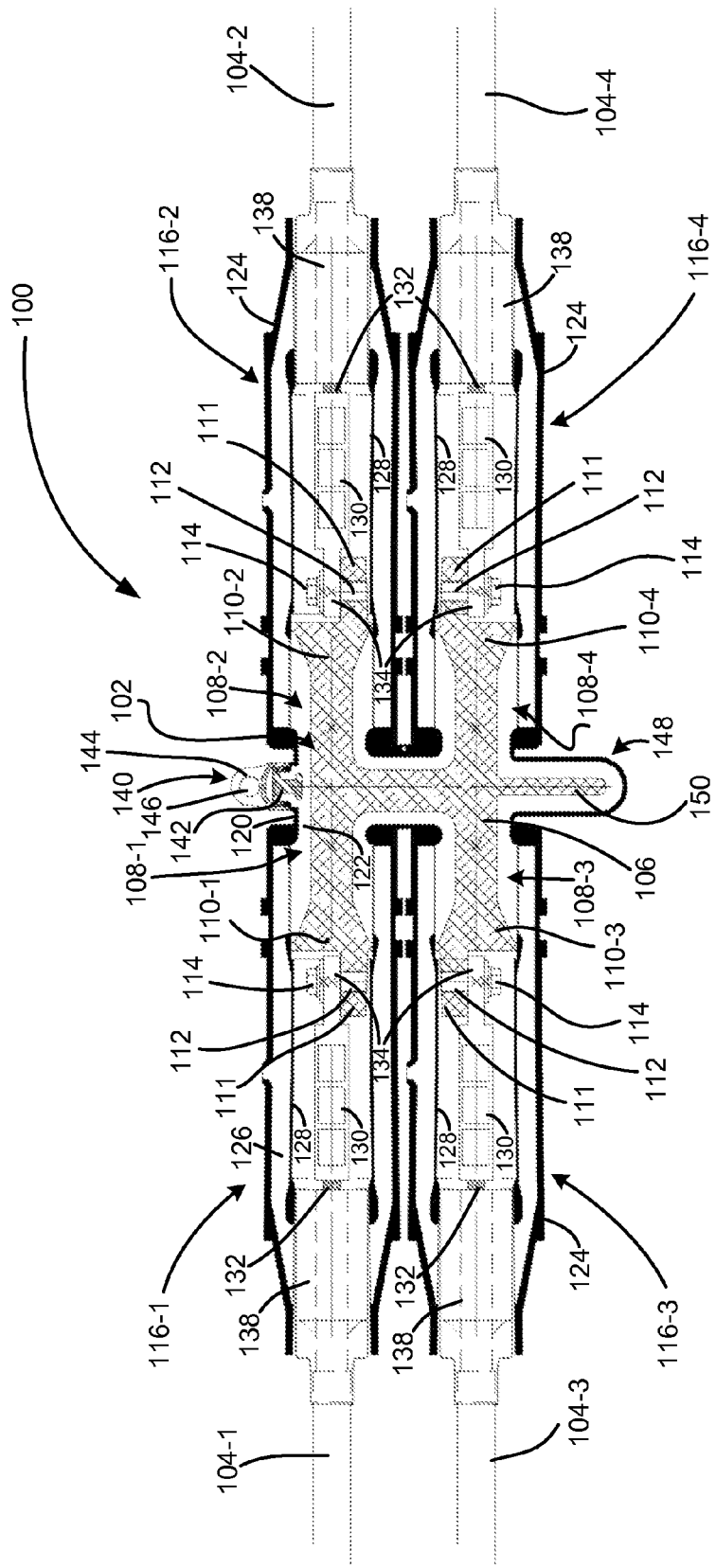
FIG. 1A is a schematic cross-sectional diagram illustrating a power cable splicing connector consistent with implementations described herein.

FIG. 1A is a schematic cross-sectional diagram illustrating a power cable splicing connector 100 configured in a manner consistent with implementations described herein. As shown in FIG. 1, power cable splicing connector 100 may include a four-way yoke 102 for enabling connection of power cables 104-1, 104-2, 104-3, and 104-4 (collectively "power cables 104," and individually "power cable 104-$x$"). For example, power cable 104-1 may be a supply cable and cables 104-2 to 104-4 may be load cables. Other types of power cable splicing connectors may be configured in accordance with implementations described herein, such as three-way yoke connectors, two-way connectors, etc.

In one implementation, yoke 102 of power cable splicing connector 100 may include a central conductor 106 and number of splice openings 108-1 to 108-4 (collectively "splice openings 108," and individually "splice opening 108-$x$"). Central conductor 106 may be formed of a suitably conductive material, such as copper, aluminum, or other conductive alloy. Further, as shown in FIG. 1, central conductor 106 may include outwardly extending portions 110-1 to 110-4 (collectively "outwardly extending portion 110," and individually "outwardly extending portion 110-$x$") that project from respective splice openings 108-$x$. As described in additional detail below, central conductor 106 may connect each of power cables 104-$x$ to each other power cable 104-$x$, such that voltage applied to one cable is transferred to each other cable.

Outwardly extending portions 110 may be configured to receive connector portions of power cables 104. For example, each extending portion 110-$x$ may include a spade portion 111 having a threaded bore 112 therein for receiving a connector bolt 114. In one configuration, as illustrated in FIG. 1, outwardly extending portion 110-1 extends oppositely from outwardly extending portion 110-2 and outwardly extending portion 110-3 extends oppositely from outwardly extending portion 110-4. Furthermore, outwardly extending portions 110-1 and 110-2 may be oriented parallel to outwardly extending portions 110-3 and 110-4, respectively. Such a configuration may provide for compact splicing or splitting of a power supply cable (e.g., cable 104-1) to multiple load cables (e.g., cables 104-2 to 104-4).

As shown in FIG. 1A, each splice opening 108-$x$ includes a cable receptacle interface that includes a substantially cylindrical flange or cuff portion configured to frictionally engage a cable receptacle 116-$x$ (individually, cable receptacle 116-$x$, or collectively, cable receptacles 116). For example, an inside diameter of a forward end of cable receptacle 116-$x$ may be sized to frictionally engage the cuff portion of splice opening 108-$x$. Each cable receptacle 116 be substantially cylindrical and may be configured to surround and protect an interface between power cables 104 and extending portions 110.

Yoke 102 may include an outer shield 120 formed from, for example, a peroxide-cured synthetic rubber, commonly referred to as EPDM (ethylene-propylene-dienemonomer). Within shield 120, yoke 102 may include an insulative inner housing 122, typically molded from an insulative rubber or epoxy material. Central conductor 106 may be enclosed within insulative inner housing 122.

Regarding cable receptacles 116, each cable receptacle 116-x may include an EPDM outer shield 124 and an insulative inner housing 126, typically molded from an insulative rubber or epoxy material. Cable receptacle 116-x further includes a conductive or semi-conductive insert 128 having a bore therethrough. Upon assembly, cable receptacle 116 surrounds the interface between power cable 104-x and extending portion 110-x. In one implementation, a forward end of insert 128 may be configured to frictionally engage outwardly extending portion 110-x of central conductor 106 upon assembly of splicing connector 100, thereby ensuring the electrical integrity of splicing connector 100.

Referring to power cables 104, a forward end of each power cable 104-x may be prepared by connecting power cable 104 to a crimp connector 130. Crimp connector 130 may include a substantially cylindrical assembly configured to receive a cable conductor 132 of power cable 104-x therein. During preparing of power cable 104-x, a portion of crimp connector 130 may be physically deformed (e.g., crimped) to fasten crimp connector 130 to cable conductor 132. Crimp connector portion 130 may include a forward spade portion 134 configured to be securely fastened to a spade portion 111 of outwardly extending portion 110-x of central conductor 106. For example, forward spade portion 134 may include a bore (not shown) configured to align with bore 112 in spade portion 111. Connector bolt 114 may be inserted through the bore and into threaded bore 112 during assembly of splice connector 100.

As shown in FIG. 1A, each of the prepared power cables 104 may further include an adapter 138 disposed rearwardly relative to crimp connector 130. Adapter 138 may be affixed to power cable 104-x and may provide a frictional engagement with a rearward portion of cable receptacle 116-x. In one implementation, adapter 138 may be formed of an insulative material, such as rubber or epoxy.

In one exemplary implementation, power cable splicing connector 100 may include a voltage detection test point assembly 140 for sensing a voltage in splicing connector 100. Voltage detection test point assembly 140 may be configured to allow an external voltage detection device, to detect and/or measure a voltage associated with splicing connector 100.

For example, as illustrated in FIG. 1A, voltage detection test point assembly 140 may include a test point terminal 142 embedded in a portion of yoke inner housing 122 and extending through an opening within yoke outer shield 120. In one exemplary embodiment, test point terminal 142 may be formed of a conductive metal or other conductive material. In this manner, test point terminal 142 may be capacitively coupled to the electrical conductor elements (e.g., central conductor 106) within splicing connector 100.

Consistent with implementations described herein, a test point cap 144 may sealingly engage portion test point terminal 142 and outer shield 120. In one implementation, test point cap 144 may be formed of a semi-conductive material, such as EPDM compounded with conductive additives. When test point terminal 142 is not being accessed, test point cap 144 may be mounted on test point assembly 140. Because test point cap 144 is formed of a conductive or semi-conductive material, test point cap 144 may ground the test point when in position. Test point cap 144 may include an aperture 146 for facilitating removal of test point cap 144, e.g., using a hooked lineman's tool.

Consistent with implementations described herein, yoke 102 may include a sacrificial appendage 148 projecting therefrom. As shown in FIG. 1A, sacrificial appendage 148 may include a sacrificial conductor extension 150 projecting from central conductor 106. Portions of insulative inner housing 122 and outer housing 120 may be formed around sacrificial conductor extension 150. In one implementation, sacrificial appendage 148 may project substantially perpendicularly from outwardly extending portions 110, so as to be relatively free of encumbrances.

When it is necessary for work to be performed on any of power cables 104 (or devices connected to power cables 104), a worker may cut through sacrificial appendage 148 (e.g., with a hydraulic cable cutter, or similar tool) to ensure that the electrical system that splicing connector 100 is connected to has been properly de-energized and is, therefore, safe to work on. When it is time to re-energize splicing connector 100, yoke 102 may be replaced with a new yoke 102, having an intact sacrificial appendage 148.

Figure 1B:
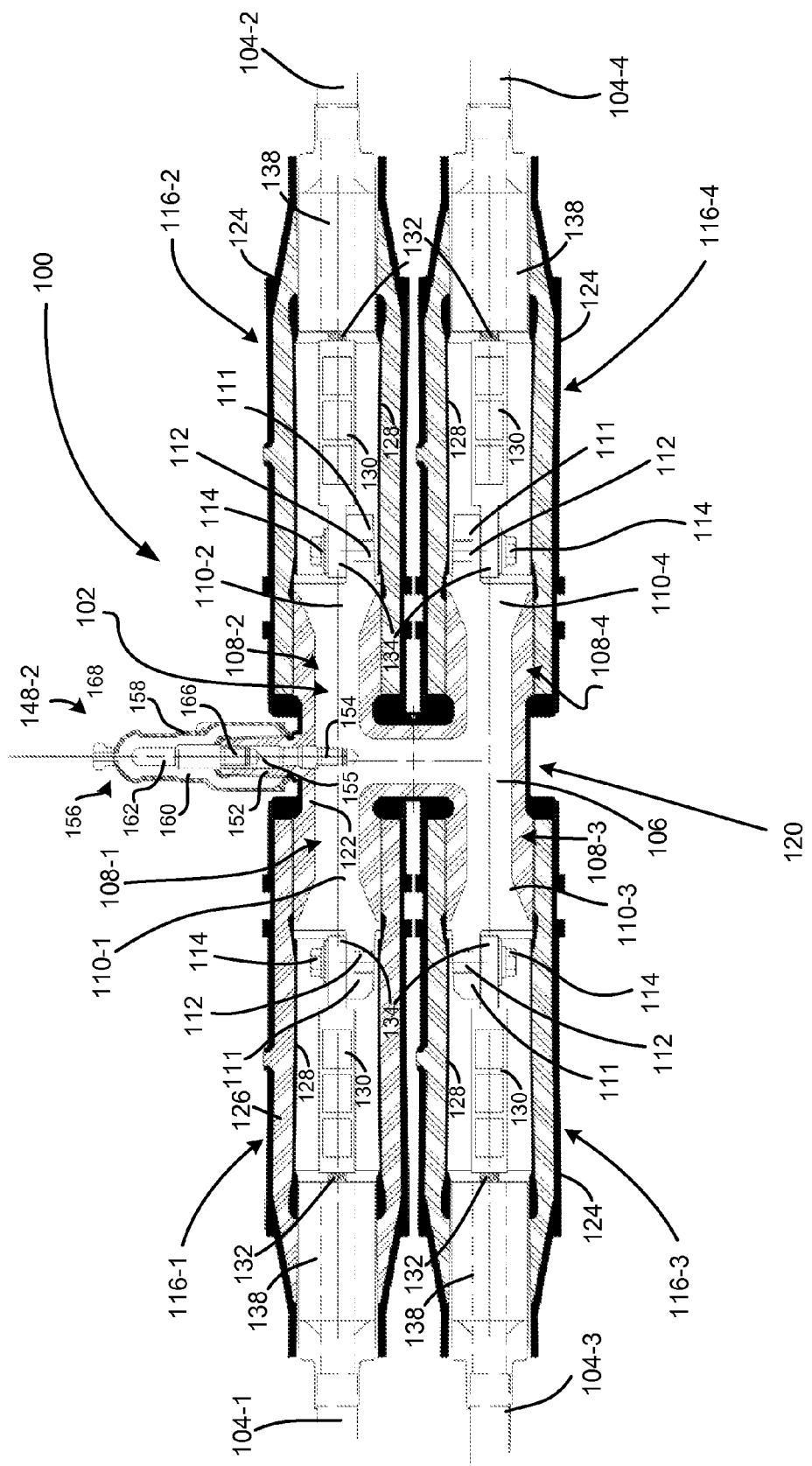
FIG. 1B is a schematic partial cross-sectional diagram illustrating a power cable splicing connector configured in a manner consistent with another implementation described herein.
Figure 1C:
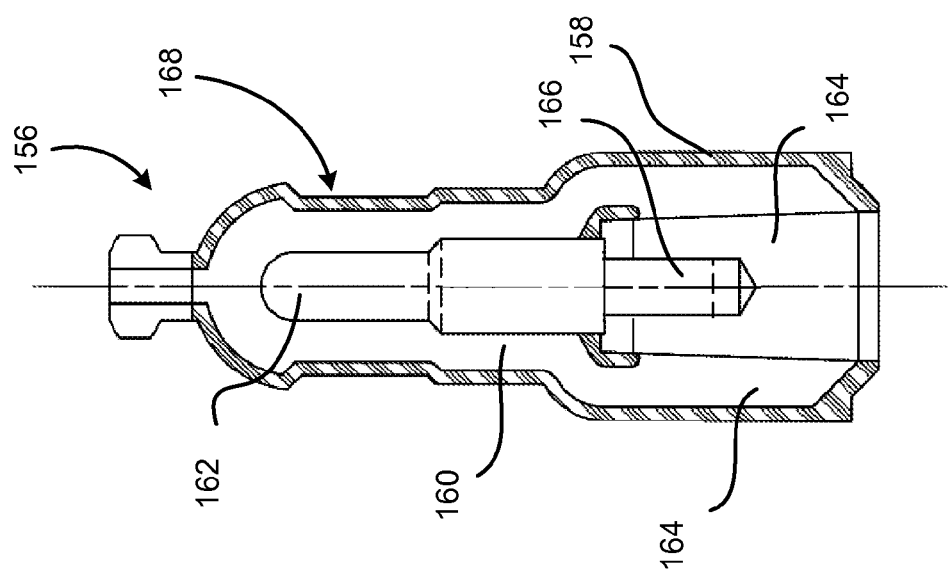
FIG. 1C is a cross-sectional diagram of the sacrificial cap of FIG. 1B.

FIG. 1B is a schematic partial cross-sectional diagram illustrating power cable splicing connector 100 configured in a manner similar to that described above with respect to FIG. 1A. FIG. 1C is a partial cross-sectional diagram illustrating the sacrificial cap of FIG. 1B. Where appropriate, FIGS. 1B and 1C use the same reference numbers to identify the same or similar elements.

As shown in FIGS. 1B and 1C, yoke 102 and the portions of cable splicing connector 100 associated with power cables 104-2 to 104-4 remain substantially similar to the embodiment describe above with respect to FIG. 1A. However, unlike the embodiment of FIG. 1A, sacrificial appendage 148 (referred to as element 148-2 in FIGS. 1B and 1C) may include a modular configuration configured for removable attachment and/or replacement on yoke 102.

As shown in FIG. 1B, yoke 102 may include a sacrificial appendage connection portion 152 projecting outwardly therefrom. In one implementation, sacrificial appendage connection portion 152 may be integrally formed with inner housing 122 and may include a contact 154 provided therein. Contact 154 may extend into a corresponding portion of central conductor 106, such as via a threaded bore provided in central conductor 106. Contact 154 may include a female thread 155 at an outer end thereof for receiving a sacrificial cap 156.

As shown in FIGS. 1B and 1C, sacrificial cap 156 may include an EPDM outer shield 158 and an insulative inner housing 160, typically molded from an insulative rubber or epoxy material. Sacrificial cap 156 may further include a sacrificial conductor 162 received within a rearward portion of inner housing 160. Furthermore, a forward portion of sacrificial cap 156 may include a cavity 164 therein (shown in FIG. 1C) for engaging a projecting portion of sacrificial appendage connection portion 152.

A forward portion of outer shield 158 and inner housing 160 may be configured to surround and protect an interface between sacrificial appendage connection portion 152 and sacrificial conductor 162. In one implementation, a forward end of outer shield 158 and inner housing 160 may be configured to frictionally engage a stepped or notched outer configuration of sacrificial appendage connection portion 152 upon assembly of splicing connector 100, thereby ensuring the electrical integrity of splicing connector 100.

Consistent with implementations described herein, sacrificial conductor 162 may include a conductive threaded male protrusion 166 extending axially therefrom. As described above, the projecting portion of contact 154 may include threaded female cavity 155. Male protrusion 166 may correspond to threaded female portion 155 in contact 154 to couple contact 154 to sacrificial conductor 162, thereby conductively connecting sacrificial conductor 162 to central conductor 106 of yoke 102. In other implementations, the male/female relationship may be reversed.

In one implementation, a cut-through region 168 may be provided in an outer portion of sacrificial cap 156 in a region overlying at least a portion of sacrificial conductor 162. In some implementations, indicia relating to cut-through region 168 may be provided on a surface of outer housing 158 for indicating that a user is to cut through sacrificial cap 156 at cut-through region 168.

When it is necessary for work to be performed on any of power cables 104 (or devices connected to power cables 104), a worker may cut through sacrificial cap 156 at cut-through region 168 (e.g., with a grounded hydraulic cable cutter, or similar tool) to ensure that electrical the system that splicing connector 100 is connected to has been properly de-energized and is, therefore, safe to work on. When it is time to reenergize splicing connector 100, the cut-through sacrificial cap 156 may be removed and a new or replacement sacrificial cap 156 may be installed.

Figure 2A:
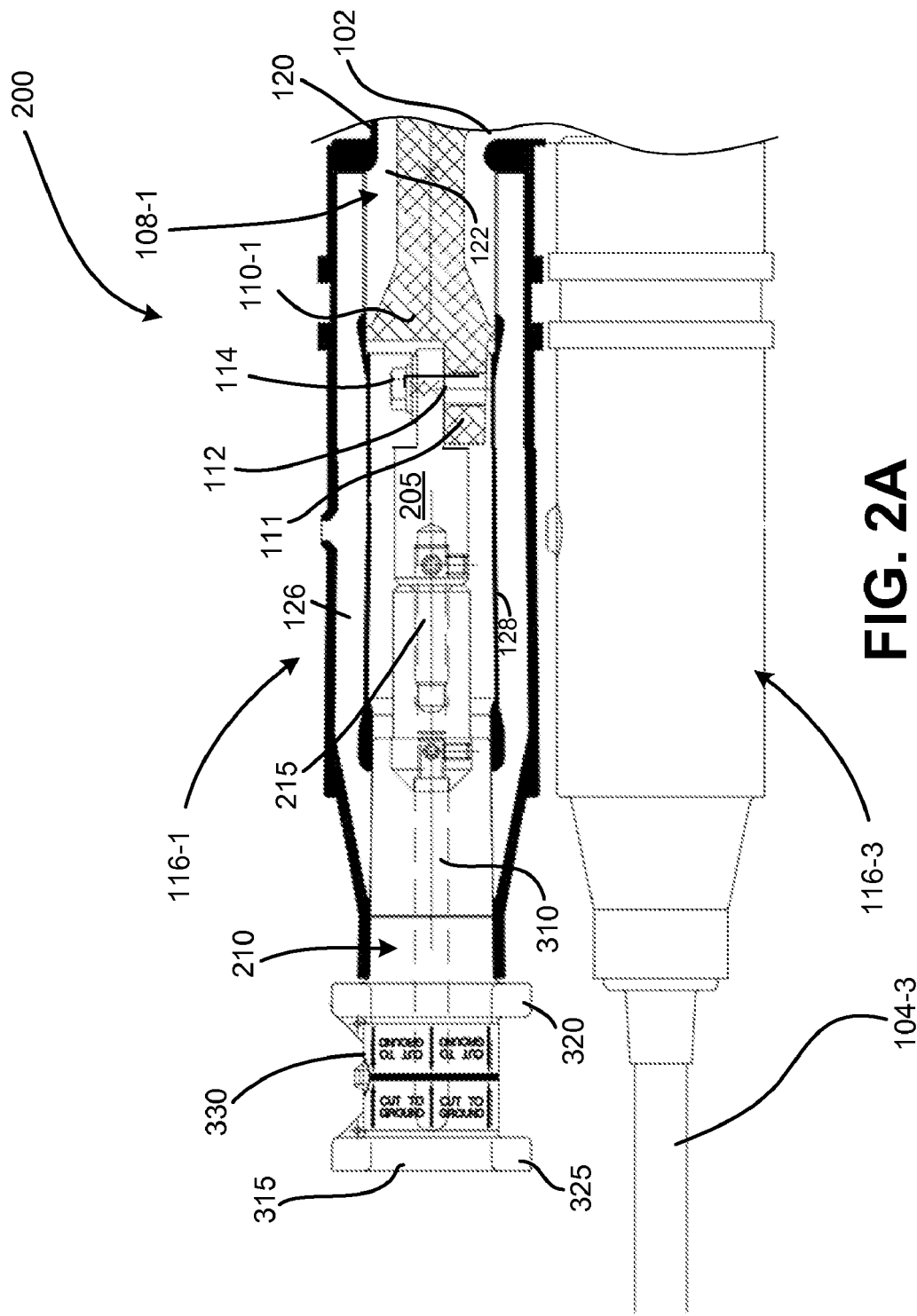
FIG. 2A is a schematic partial cross-sectional diagram illustrating a power cable splicing connector configured in a manner consistent with another implementation described herein.

FIG. 2A is a schematic partial cross-sectional diagram illustrating a power cable splicing connector 200 configured in a manner consistent with another implementation described herein. FIG. 2B illustrates power cable splicing connector 200 in an exploded (e.g., unassembled) view. Where appropriate, FIGS. 2A and 2B use the same reference numbers to identify the same or similar elements.

As shown in FIGS. 2A and 2B, yoke 102 and the portions of cable splicing connector 200 associated with power cables 104-2 to 104-4 remain substantially similar to the embodiment describe above with respect to FIG. 1A. However, unlike the embodiment of FIG. 1A, yoke 102 does not include a sacrificial appendage (e.g., appendage 148) extending therefrom. Rather, as described below, one of splice openings 108-1 to 108-4 (e.g., splice opening 108-1) and the corresponding outwardly extending portion 110 (e.g., extending portion 110-1) may be used to provide a sacrificial appendage or portion to splicing connector 200.

As shown in FIGS. 2A and 2B, a sacrificial adapter spade connector 205 may be connected to spade portion 111 of outwardly extending portion 110-1 via connector bolt 114. Sacrificial adapter spade connector 205 may be configured to provide a releasable attachment mechanism for connecting sacrificial adapter 210 to yoke 102. For example, sacrificial adapter spade connector 205 may include a conductive threaded male protrusion 215 extending axially therefrom in a rearward direction. As described below, sacrificial adapter 210 may include a correspondingly threaded female cavity for conductively securing sacrificial adapter 210 to male protrusion 215. In other implementations, the male/female relationship may be reversed. For example, sacrificial adapter spade connector 205 may include a female threaded cavity for receiving threaded male protrusion 215 extending from sacrificial adapter 210.

As shown in FIGS. 2A and 2B, cable receptacle 116-1 may surround spade extending portion 110-1, spade portion 111, and sacrificial adapter spade connector 205 in a manner similar to that described above with respect to FIG. 1A. For example, cable receptacle 116-1 be substantially cylindrical and may be configured to surround and protect an interface between power sacrificial cable adapter connector 205 and extending portion 110-1. Further, forward end of insert 128 in receptacle 116-1 may be configured to frictionally engage outwardly extending portion 110-1 upon assembly of splicing connector 200, thereby ensuring the electrical integrity of splicing connector 200.

FIG. 3 is a cross-sectional view of sacrificial adapter 210. As shown, sacrificial adapter 210 may have a substantially cylindrical configuration that includes an insulative adapter housing 300, a connector portion 305, a sacrificial bar 310, and a semi-conductive jacket 315. Insulative adapter housing 300 may be formed of, for example, EPDM and may be sized to frictionally engage rearward openings in outer shield 124 and inner insert 128 of cable receptacle 116-1.

Insulative adapter housing 300 may axially surround sacrificial bar 310 and a rearward portion of connector portion 305 so that, upon assembly, sacrificial bar 310 is electrically connected to central conductor 106 of yoke 102 (e.g., via sacrificial adapter spade connector 205). As described briefly above, connector portion 305 may include a threaded cavity therein for receiving threaded male protrusion 215 extending from sacrificial adapter spade connector 205.

Semi-conductive jacket 315 may be formed about a rearward portion of insulative adapter housing 300, such that a portion of sacrificial adapter 210 extending from cable receptacle 116-1 is encased in semi-conductive jacket 315, thereby ensuring electrical continuity on an outer surface of splicing connector 200. As shown in FIGS. 2A-3, semi-conductive jacket 315 may include forward and rearward annular shoulder portions 320 and 325, and a central cut-through portion 330.

In one implementation, forward and rearward annular shoulder portions 320/325 may radially project from a central axis of sacrificial adapter 210 and may provide a means with which to insert sacrificial adapter 210 into cable receptacle 116-1. In addition, as shown in FIG. 2A, forward annular shoulder portion 320 may provide a stop against receptacle 116-1, cut-through portion 330 may be provided in a region between forward annular shoulder portion 320 and rearward annular shoulder portion 325 and may be provided in a region overlying at least a portion of sacrificial bar 310. In some implementations, cut-through portion 330 may be provided with indicia 335 for indicating that a user is to cut through sacrificial adapter 210 at cut-through portion 330.

When it is necessary for work to be performed on any of power cables 104 (or devices connected to power cables 104), a worker may cut through sacrificial adapter 210 at cut-through portion 330 (e.g., with a grounded hydraulic cable cutter, or similar tool) to ensure that the electrical system that splicing connector 200 is connected to has been properly de-energized and is, therefore, safe to work on. When it is time to re-energize splicing connector 200, the cut-through sacrificial adapter 210 may be removed and a new or replacement sacrificial adapter 210 may be installed.

Figure 4A:
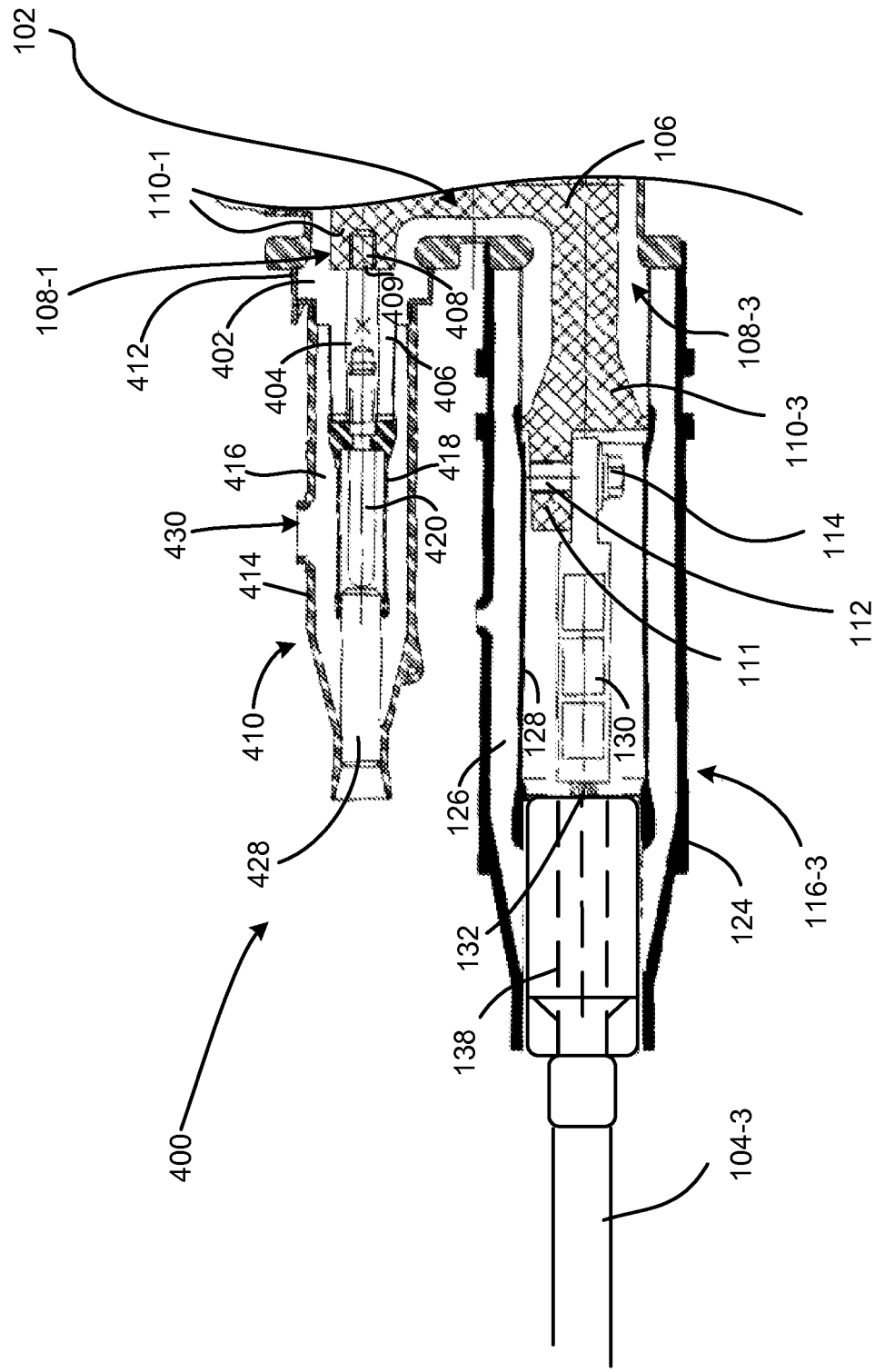
FIG. 4A is a schematic partial cross-sectional diagram illustrating a power cable splicing connector configured in a manner consistent with yet another implementation described herein.
Figure 4B:
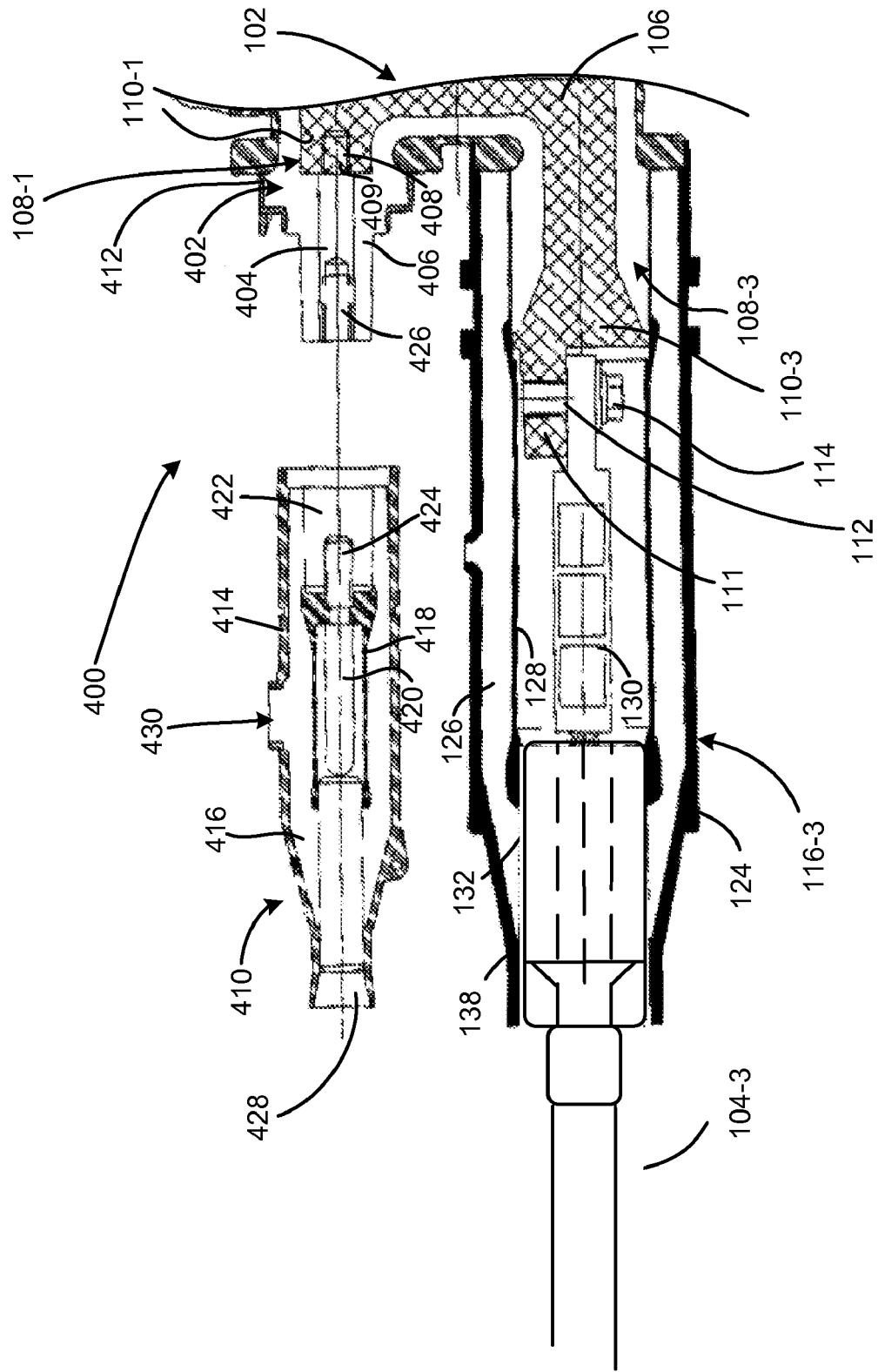
FIG. 4B illustrates the power cable splicing connector of FIG. 4A in an exploded (e.g., unassembled) view.

FIG. 4A is a schematic partial cross-sectional diagram illustrating a power cable splicing connector 400 configured in a manner consistent with yet another implementation described herein. FIG. 4B illustrates power cable splicing connector 400 in an exploded (e.g., unassembled) view. Where appropriate, FIGS. 4A and 4B use the same reference numbers to identify the same or similar elements.

As shown in FIGS. 4A and 4B, yoke 102 and the portions of cable splicing connector 400 associated with power cables 104-2 to 104-4 remain substantially similar to the embodiment described above with respect to FIG. 1A. However, unlike the embodiment of FIG. 1A, yoke 102 does not include a sacrificial appendage extending therefrom. Rather, as described below, one of splice openings 108-1 to 108-4 (e.g., splice opening 108-1) and the corresponding outwardly extending portion 110 (e.g., extending portion 110-1) may be used to provide a sacrificial portion for splicing connector 200.

As shown in FIGS. 4A and 4B, outwardly extending portion 110-1 may include a sacrificial interface 402 connected thereto. Sacrificial interface 402 may include a conductor portion 404 and an insulative portion 406. In one implementation, conductor portion 404 may be conductively coupled to extending portion 110-1, such as via a threaded engagement between conductor portion 404 and outwardly extending portion 110-1 of central conductor 106. For example, extending portion 110-1 may be provided with a female threaded cavity 408 and a forward portion of conductor portion 404 of sacrificial interface 402 may be provided with a corresponding male threaded portion 409. In other implementations, the male/female relationship may be reversed.

Insulative portion 406 of sacrificial interface 402 may radially surround conductor portion 404. As shown, in one implementation, insulative portion 406 may include a stepped outer configuration for sealingly receiving a sacrificial receptacle 410 secured thereon. In one implementation, insulative portion 406 of sacrificial interface 402 may include an outer shield 412 formed from, for example, EPDM.

As shown in FIGS. 4A and 4B, sacrificial receptacle 410 may be configured for releasable and replaceable attachment to yoke 102 following a sacrificial use, as described below. In one implementation, sacrificial receptacle 410 may be based on a non-sacrificial receptacle re-purposed from other products (e.g., 200 Amp deadbreak equipment, etc.). In this manner, a cost savings in manufacturing sacrificial receptacle 410 may be realized.

Sacrificial receptacle 410 may include an EPDM outer shield 414 and an insulative inner housing 416, typically molded from an insulative rubber or epoxy material. Sacrificial receptacle 410 may further include a conductive or semi-conductive insert 418 having a bore formed therethrough. As shown, semi-conductive insert 418 may be configured to receive and surround a sacrificial conductor 420 therein. Furthermore, a forward portion of sacrificial receptacle 410 may include a cavity 422 therein for engaging a rearward portion of sacrificial interface 402.

A forward portion of outer shield 414 and inner housing 416 may be configured to surround and protect an interface between sacrificial interface 402 and sacrificial conductor 420. In one implementation, a forward end of outer shield 414 and inner housing 416 may be configured to frictionally engage the stepped outer configuration of sacrificial interface 402 upon assembly of splicing connector 400, thereby ensuring the electrical integrity of splicing connector 400.

Consistent with implementations described herein, sacrificial conductor 420 may include a conductive threaded male protrusion 424 extending axially therefrom in a forward direction. A rearward portion of sacrificial interface 402 may include a correspondingly threaded female cavity 426 for conductively securing sacrificial interface 402 to sacrificial conductor 420, thereby connecting sacrificial conductor 420 to central conductor 106 of yoke 102. In other implementations, the male/female relationship may be reversed.

A rearward portion of sacrificial receptacle 410 (e.g., the rearward end of the bore semi-conductive insert 418) may be configured to receive an insulative plug 428 therein. As described above, in some implementations, sacrificial receptacle 410 may be re-purposed from an existing receptacle in which the rearward end of the bore is configured for receiving a power cable or other element therein. Because sacrificial receptacle 410 does not connect to a power cable, insulative plug 428 may be provided to effectively seal the opening within the rearward end of sacrificial receptacle 410.

In one implementation, a cut-through region 430 may be provided in an outer surface of sacrificial receptacle 410 in a region overlying at least a portion of sacrificial conductor 420. In some implementations, cut-through region 430 may be provided with indicia for indicating that a user is to cut through sacrificial receptacle 410 at cut-through region 430.

When it is necessary for work to be performed on any of power cables 104 (or devices connected to power cables 104), a worker may cut through sacrificial receptacle 410 at cut-through region 430 (e.g., with a grounded hydraulic cable cutter, or similar tool) to ensure that the electrical system that splicing connector 400 is connected to has been properly de-energized and is, therefore, safe to work on. When it is time to re-energize splicing connector 400, the cut-through sacrificial receptacle 410 may be removed and a new or replacement sacrificial receptacle 410 may be installed.

FIGS. 5A and 5B are cross-section and side views, respectively, of an alternative sacrificial appendage 500 used as an alternative to sacrificial receptacle 410 of FIGS. 4A and 4B. Unlike the embodiment of FIGS. 4A and 4B, sacrificial appendage 500 is not a re-purposed cable receptacle or interface element.

As in the embodiment of FIGS. 4A and 4B, insulative portion 406 of sacrificial interface 402 may include a stepped outer configuration for sealingly receiving sacrificial appendage 500 secured thereon. Sacrificial appendage 500 may be configured for releasable and replaceable attachment to yoke 102 following a sacrificial use, as described below.

Sacrificial appendage 500 may include an EPDM outer shield 505 and an insulative inner housing 510, typically molded from an insulative rubber or epoxy material. Sacrificial appendage 500 may further include a sacrificial conductor 515 received within a rearward portion of inner housing 510. Furthermore, a forward portion of sacrificial appendage 500 may include a cavity 520 therein for engaging a rearward portion of sacrificial interface 402.

A forward portion of outer shield 505 and inner housing 510 may be configured to surround and protect an interface between sacrificial interface 402 and sacrificial conductor 515. In one implementation, a forward end of outer shield 505 and inner housing 510 may be configured to frictionally engage the stepped outer configuration of sacrificial interface 402 upon assembly of splicing connector 400, thereby ensuring the electrical integrity of splicing connector 400.

Consistent with implementations described herein, sacrificial conductor 515 may include a conductive threaded male protrusion 525 extending axially therefrom in a forward direction relative to a remainder of sacrificial conductor 515. As described above, rearward portion of sacrificial interface 402 may include threaded female cavity 426 for conductively securing sacrificial interface 402 to male protrusion 525 of sacrificial conductor 515, thereby connecting sacrificial conductor 515 to central conductor 106 of yoke 102. In other implementations, the male/female relationship may be reversed.

In one implementation, a cut-through region 530 may be provided in a rearward portion of sacrificial appendage 500 in a region overlying at least a portion of sacrificial conductor 515. In some implementations, indicia relating to cut-through region 530 may be provided on a surface of outer housing 515 for indicating that a user is to cut through sacrificial appendage 500 at cut-through region 530.

When it is necessary for work to be performed on any of power cables 104 (or devices connected to power cables 104), a worker may cut through sacrificial appendage 500 at cut-through region 530 (e.g., with a grounded hydraulic cable cutter, or similar tool) to ensure that electrical the system that splicing connector 400 is connected to has been properly de-energized and is, therefore, safe to work on. When it is time to reenergize splicing connector 400, the cut-through sacrificial appendage 500 may be removed and a new or replacement sacrificial appendage 500 may be installed.

By providing an effective and safe mechanism for establishing demonstrative evidence of a de-energized system/circuit in an electrical connector, various personnel may be more easily able to safely identify and confirm a de-energized condition in a switchgear assembly. More specifically, consistent with aspects described herein, personnel may be able to create and view a physical disconnect of a connected portion of the electrical system without damaging (and necessarily replacing) connected power cables or other components.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, implementations described herein may also be used in conjunction with other devices, such as high voltage switchgear equipment, including 15 kV, 25 kV, or 35 kV equipment.

For example, various features have been mainly described above with respect to electrical splicing connectors. In other implementations, other medium/high voltage power components may be configured to include the sacrificial appendage/adapter configurations described above.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An electrical connector assembly, comprising:
   a yoke, comprising:
      an outer housing; and
      a central conductor provided within the outer housing, wherein the central conductor comprises at least three outwardly extending portions,
   wherein a first outwardly extending portion and a second outwardly extending portion are operatively coupled to first and second power cables, respectively, and
   wherein a third outwardly extending portion comprises a sacrificial appendage configured to be cut through to confirm that the electrical connector is de-energized.

2. The electrical connector of claim 1, wherein the yoke comprises a three-way yoke, a four-way yoke, or a two-way yoke.

3. The electrical connector of claim 1, wherein each of the first outwardly extending portion and the second outwardly extending portion further comprise:
   a spade portion for connecting to the first and second power cables, respectively.

4. The electrical connector of claim 3, further comprising:
   first and second crimp connectors coupled to the first and second power cables, respectively,
   wherein the first and second crimp connectors are configured for securing to the spade portions of the first and second outwardly extending portions, respectively.

5. The electrical connector of claim 1, further comprising:
   a first cable receptacle for providing an interface between the first outwardly extending portion and the first power cable;
   a second cable receptacle for providing an interface between the second outwardly extending portion and the second power cable; and
   a third cable receptacle for providing an interface between the third outwardly extending portion and the sacrificial appendage,
   wherein the first, second, and third cable receptacles are configured for engagement with the outer housing of the yoke.

6. The electrical connector of claim 5,
   wherein the sacrificial appendage comprises a sacrificial adapter, and
   wherein the third cable receptacle is configured to releasably retain the sacrificial adapter in conductive contact with the third outwardly extending portion.

7. The electrical connector of claim 6, further comprising:
   a sacrificial adapter spade connector connected to the third outwardly extending portion within the third cable receptacle,
   wherein the sacrificial adapter spade connector releasably engages the sacrificial adapter.

8. The electrical connector of claim 7, wherein the sacrificial adapter spade connector and the sacrificial adapter are releasably connected via a threaded engagement.

9. The electrical connector of claim 6, wherein the sacrificial adapter comprises:
   an adapter housing;
   a sacrificial bar extending axially within the adapter housing and conductively connected to the third outwardly extending portion; and
   an outer jacket surrounding at least a portion of the adapter housing,
   wherein the outer jacket includes a cut-through portion overlying the sacrificial bar.

10. The electrical connector of claim 9, wherein an outer diameter of the adapter housing is approximately equal in size to a rearward opening in the third cable receptacle, such that the rearward opening in the third cable receptacle may receive at least a portion of the adapter housing therein.

11. The electrical connector of claim 9, wherein the outer jacket includes at least one annular shoulder portion formed radially therein, the annular should portion providing a stop against the third cable receptacle when the sacrificial adapter is received within the third cable receptacle.

12. The electrical connector of claim 1,
   wherein the sacrificial appendage comprises a sacrificial cap, and
   wherein the yoke is configured to releasably retain the sacrificial cap in conductive contact with the third outwardly extending portion.

13. The electrical connector of claim 1, further comprises:
   a sacrificial interface conductively coupled to the third outwardly extending portion,
   wherein the sacrificial interface is configured to releasably receive a sacrificial receptacle thereon.

14. The electrical connector of claim 13, wherein the sacrificial receptacle comprises:
   a housing; and
   a sacrificial conductor extending axially within adapter housing,
   wherein the housing includes a cut-through region overlying the sacrificial conductor, and wherein the sacrificial conductor is configured for releasable attachment to the sacrificial interface.

15. The electrical connector of claim 14, wherein the sacrificial receptacle further comprises a bore therethrough for receiving the sacrificial conductor, and wherein the sacrificial receptacle further comprises:
    an insulative plug for enclosing the sacrificial conductor within the sacrificial receptacle.

16. A method, comprising:
    providing an electrical connector having a sacrificial appendage conductively connected to a yoke of the electrical connector;
    cutting through the sacrificial appendage to confirm that the yoke is de-energized;
    performing service on equipment conductively coupled to the electrical connector;
    removing the sacrificial appendage from the yoke; and
    installing a replacement sacrificial appendage on the yoke.

17. The method of claim 16, wherein the sacrificial appendage comprises a sacrificial receptacle conductively coupled to an opening on the yoke.

18. The method of claim 17, wherein the sacrificial receptacle comprises a housing and a sacrificial conductor enclosed within the housing, wherein cutting through the sacrificial appendage further comprises:
    cutting through the housing in a region overlying the sacrificial conductor.

19. The method of claim 17, wherein the sacrificial appendage further comprises a sacrificial adapter releasably received in the sacrificial receptacle, wherein the sacrificial adapter comprises an adapter housing and a sacrificial conductor enclosed within the adapter housing,
    wherein cutting through the sacrificial appendage further comprises:
        cutting through the adapter housing in a region overlying the sacrificial conductor;
    wherein removing the sacrificial appendage further comprises:
        removing the sacrificial adapter from the sacrificial receptacle; and
    wherein installing the replacement sacrificial appendage further comprises:
        installing a replacement sacrificial adapter in the sacrificial receptacle.

20. The method of claim 16, wherein the sacrificial appendage comprises a cut-through portion, and wherein cutting through the sacrificial appendage comprises cutting through the sacrificial appendage at the cut-through portion.

21. A medium or high voltage electrical connector assembly, comprising:
    a yoke, comprising:
        an outer housing; and
        a central conductor provided within the outer housing, wherein the central conductor comprises at least three outwardly extending portions,
    wherein a first outwardly extending portion and a second outwardly extending portion are operatively coupled to first and second power cables, respectively; and
    a sacrificial receptacle conductively coupled to a third outwardly extending portion,
    wherein the sacrificial receptacle comprises:
        a receptacle housing;
        a sacrificial conductor retained in the receptacle housing,
        wherein the sacrificial conductor is configured to be releasably connected to the third outwardly extending portion, and
        wherein the sacrificial receptacle is configured to be cut through in a portion overlying the sacrificial conductor to confirm that the electrical splicing connector is de-energized.

* * * * *